(12) United States Patent
Park et al.

(10) Patent No.: US 12,438,047 B2
(45) Date of Patent: Oct. 7, 2025

(54) DOUBLE PATTERNING WITH SELECTIVELY DEPOSITED SPACER

(71) Applicant: International Business Machines Corporation, Armonk, NY (US)

(72) Inventors: Chanro Park, Clifton Park, NY (US); Hseuh-Chung Chen, Cohoes, NY (US); Koichi Motoyama, Shatin (HK); Kenneth Chun Kuen Cheng, Boxborough, MA (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 643 days.

(21) Appl. No.: 17/555,420

(22) Filed: Dec. 18, 2021

(65) Prior Publication Data
US 2023/0197511 A1    Jun. 22, 2023

(51) Int. Cl.
*H01L 23/528* (2006.01)
*H01L 21/768* (2006.01)

(52) U.S. Cl.
CPC .. *H01L 21/76885* (2013.01); *H01L 21/76837* (2013.01); *H01L 21/7684* (2013.01); *H01L 21/7685* (2013.01); *H01L 21/76865* (2013.01); *H01L 21/76883* (2013.01); *H01L 23/5283* (2013.01)

(58) Field of Classification Search
CPC  H01L 23/528; H01L 23/5283; H01L 21/7685
See application file for complete search history.

(56) References Cited

U.S. PATENT DOCUMENTS

| | | | |
|---|---|---|---|
| 5,695,810 A * | 12/1997 | Dubin | H01L 21/76831 |
| | | | 427/443.1 |
| 6,821,886 B1 * | 11/2004 | Layadi | H01L 21/76805 |
| | | | 438/653 |
| 9,147,653 B2 | 9/2015 | Yuan | |
| 9,478,497 B2 | 10/2016 | Wells | |
| 9,508,646 B2 * | 11/2016 | Omori | H01L 23/528 |
| 9,837,354 B2 | 12/2017 | Liu | |
| 9,941,164 B1 | 4/2018 | Kim | |
| 9,984,919 B1 | 5/2018 | Zhang | |
| 9,997,402 B2 * | 6/2018 | Siew | H01L 21/76823 |
| 10,269,629 B2 * | 4/2019 | Choi | H01L 21/76895 |
| 10,559,529 B2 * | 2/2020 | Wallace | H01L 23/5329 |
| 10,755,969 B2 | 8/2020 | Chu | |
| 11,004,740 B2 | 5/2021 | Yang | |
| 11,011,463 B2 * | 5/2021 | Lin | H01L 21/76834 |
| 11,244,858 B2 * | 2/2022 | Huang | H01L 23/528 |
| 12,002,865 B2 * | 6/2024 | Lee | H01L 21/823456 |

(Continued)

*Primary Examiner* — Daniel Luke
(74) *Attorney, Agent, or Firm* — Tihon Poltavets

(57) ABSTRACT

A first metal interconnection pattern is formed over a substrate. A spacer layer is selectively deposited on the exposed surfaces of the first metal interconnection pattern. Subsequently, a metal overburden layer is deposited on the spacer layer. The excess portion of the metal overburden layer is removed, i.e., that portion deposited over a top surface of the metal interconnection pattern and the spacer layer. This forms a second metal interconnection pattern. The elements of the second metal interconnection pattern are located between respective elements of the first metal interconnection pattern.

20 Claims, 17 Drawing Sheets

(56) References Cited

U.S. PATENT DOCUMENTS

| | | | |
|---|---|---|---|
| 2014/0183741 A1* | 7/2014 | Park | H01L 23/5226 257/751 |
| 2018/0240700 A1* | 8/2018 | Omori | H01L 23/53266 |
| 2019/0006234 A1 | 1/2019 | Fox | |
| 2020/0044013 A1 | 2/2020 | Cheng | |
| 2020/0357686 A1 | 11/2020 | Mignot | |
| 2021/0125836 A1 | 4/2021 | Huang | |
| 2022/0139772 A1* | 5/2022 | Jezewski | H01L 23/5226 257/758 |

* cited by examiner

DOUBLE PATTERNING WITH SELECTIVELY DEPOSITED SPACER

BACKGROUND OF THE INVENTION

This disclosure relates to integrated circuit devices, and more specifically, to a method and structure to improve spacer fabrication when manufacturing semiconductor devices.

In semiconductor chips, the devices fabricated in or on a semiconductor substrate are connected with a metallic interconnection structure made of metal lines and "vias" which interconnect the metal lines. The metal lines are arranged in horizontal layers, i.e., parallel to the substrate, and separated by layers of dielectrics while vias are disposed vertically in openings in the dielectric to interconnect the layers of metal lines. For 3 nm chips and beyond, copper as a material for lines, vias and other interconnects is reaching its limit in terms of resistivity, filling and reliability. Thus, alternative metals such as ruthenium (Ru) are being considered for fabricating such interconnects. For some of the alternative metals, e.g., Ru, when fabricating interconnects, both a subtractive etch scheme and a Damascene scheme are being considered. However, both schemes present big challenges at such small geometries. For a subtractive scheme, dry etching a thick Ru film at these tighter pitches is very difficult. For a Damascene scheme, a line "wiggling" issue has been observed by an Ru fill at tighter pitch. Line "wiggling" means that the geometry of the line is not the desired linear pattern provided by the lithography. Instead, there are slight bends to the metal line pattern which creates high line resistance and makes registration of subsequent layers very difficult given the irregularity and randomness of the line wiggling.

Thus, reducing the line wiggling would improve the ability to fabricate interconnect structures at the small dimensions forecast to be required in semiconduction structure. The present disclosure presents a method and structure to address the above described problem.

BRIEF SUMMARY

According to this disclosure, a structure and a method for fabricating interconnections for an integrated circuit device is described. A first metal interconnection pattern is formed over a substrate. A spacer layer is selectively deposited on the exposed surfaces of the first metal interconnection pattern. Subsequently, a metal overburden layer is deposited on the spacer layer. The excess portion of the metal overburden layer is removed, i.e., that portion deposited over a top surface of the metal interconnection pattern and the spacer layer. This forms a second metal interconnection pattern. The elements of the second metal interconnection pattern are located between respective elements of the first metal interconnection pattern.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
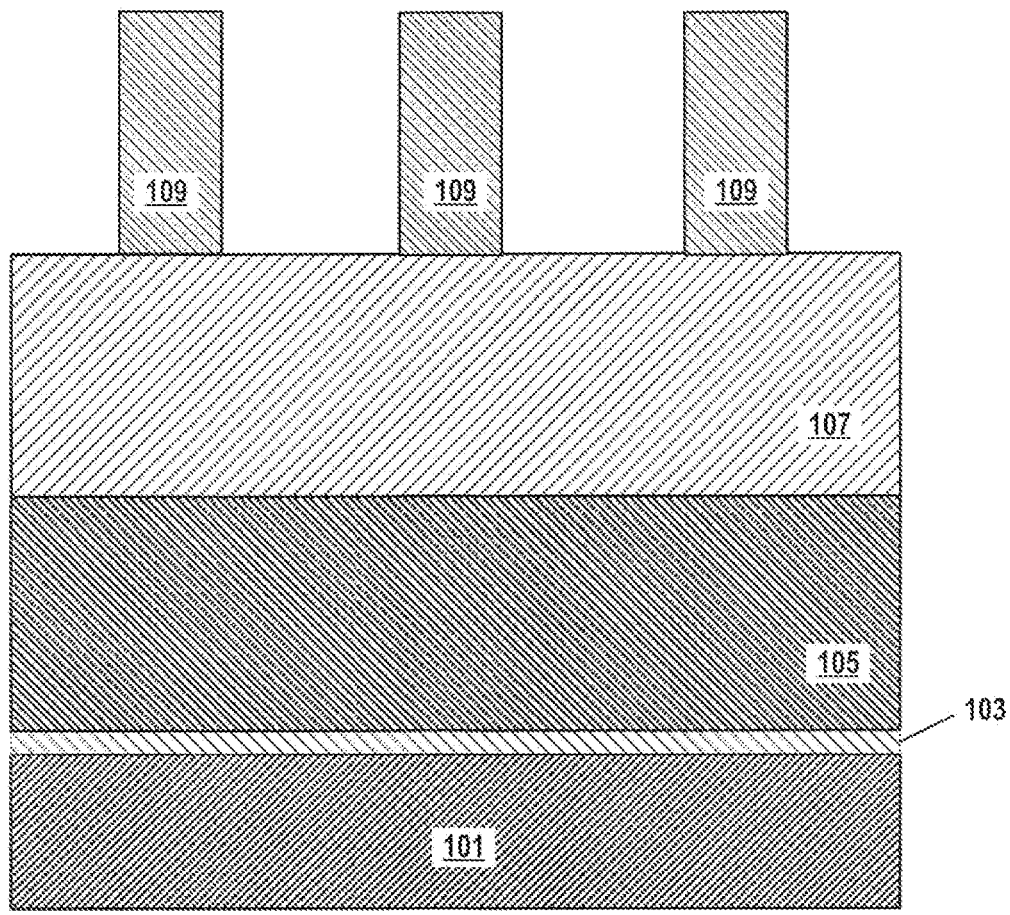
FIG. 1 is a cross-sectional diagram depicting an intermediate structure after a trench patterning process according to a first embodiment of the invention.

At a high level, embodiments of the invention provide a selective spacer process which provides improved linearity when producing interconnect structures for small dimensions. As compared to the prior art, the selective spacer deposition removes an etch process which created nonuniform height in the substrate leading to non-linearity if the subsequent metal lines or other interconnects. The benefits of the invention include minimal line wiggling, a more uniform line height, and more uniform etch processing. In embodiments of the invention, the metal interconnects are ruthenium (Ru), and the spacers are comprised of a metallic layer that can be selectively deposited on the metal interconnect, e.g., cobalt (Co), copper (Cu) or titanium nitride (TiN). In embodiments of the invention, metal interconnects can be fabricated to have a critical dimension of 3 nm or less.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

Aspects of the present invention will be described in terms of a given illustrative embodiment; however, other embodiments which include other structures, substrates, materials and process features and steps can be varied within the scope of aspects of the present invention.

When an element such as a layer, region or substrate is referred to as being "over" another element, it can be directly on the other element or intervening elements can also be present. In contrast, when an element is referred to as being "on", "directly over" or "contacting" another element, there are no intervening elements present. When an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Those skilled in the art will appreciate that descriptions in the specification to an embodiment means that a particular feature, structure, characteristic, is included in at least one embodiment, but not all embodiments. The phrase "in an embodiment", as well as any other variations, appearing in various places throughout the specification are not necessarily all referring to the same embodiment.

Embodiments will be explained below with reference to the accompanying drawings.

FIG. 1 is a cross-sectional diagram depicting an intermediate structure after a trench patterning process according to a first embodiment of the invention. Substrate layer 101 represents any layer or set of layers in a semiconductor device. In preferred embodiments, the substrate layer 101 comprises a dielectric such silicon dioxide (SiO2), silicon nitride (SiN), silicon carbide (SiC), or low-k dielectric materials. In preferred embodiments, the substrate comprises a number of dielectric layers and semiconductor material layers arranged to provide semiconductor devices, such as field effect transistors (FETs), fin type field effect transistors (FinFETs), bipolar junction transistors (BJT) and combinations thereof.

On top of the substrate layer 101 is a liner layer 103. The functions of a liner layer include adhesion to the substrate so that subsequent layers have a strong physical bond to the substrate layer 101. Other functions can include diffusion protection, e.g., if the subsequent layers diffuse into the substrate, as well as functioning as a seed layer so that the subsequent layers have good deposition characteristics. In some embodiments, tantalum nitride (TaN) and titanium nitride (TiN) are suitable as liner layers. Conventional deposition processes such as physical vapor deposition (PVD) are used in embodiments of the invention. In other embodiments, other conventional deposition processes such as an atomic layer deposition (ALD), chemical vapor deposition (CVD), plasma enhanced chemical vapor deposition (PECVD) are used. Other suitable liner layers such as Ti, Ta, WN are used in other embodiments.

On top of the liner layer 103 is a metal layer 105. This layer will be patterned in subsequent steps to provide some of the metal interconnects in the finished semiconductor device. In preferred embodiments, this layer is ruthenium (Ru). Other materials used for this layer in the interconnects of other embodiments include cobalt (Co), tungsten (W), rhodium (Rh) and molybdenum (Mo). Ru and the alternatives mentioned above are deposited using conventional deposition processes such as the PVD, ALD, CVD and PECVD processes mentioned above in a thickness substantially equal to the thickness desired in the final device.

A hardmask layer 107 is deposited on top of the metal layer 105. Suitable hardmask layers include, but are not limited to, Nb, NbN, W, WN, Ta, TaN, Ti, TiN, Ru, Mo, Cr, V, Pd, Pt, Rh, Sc, Al, Cu, and other high melting point metals or conductive nitrides. Dielectric hardmasks can also be used in alternative embodiments. The hardmask is deposited using conventional deposition processes such as PVD, ALD, CVD and PECVD processes in a thickness sufficient to pattern the metal layer, given the selectivity of the hardmask and metal layers with respect to a selected etch process used for the patterning.

Finally, a patterning layer(s) is deposited and patterned according to known processes. Some known lithography processes use multiple layers in a lithography stack formed on the hardmask layer 107. The lithographic stack can include a resist layer, an organic planarization layer (OPL) and an antireflective coating (ARC) layer. Other known lithography processes are used in other embodiments of the invention. A requirement of embodiments of the invention at small dimensions is that the lithography process chosen be capable of patterning features at the desired dimension.

Figure 2:
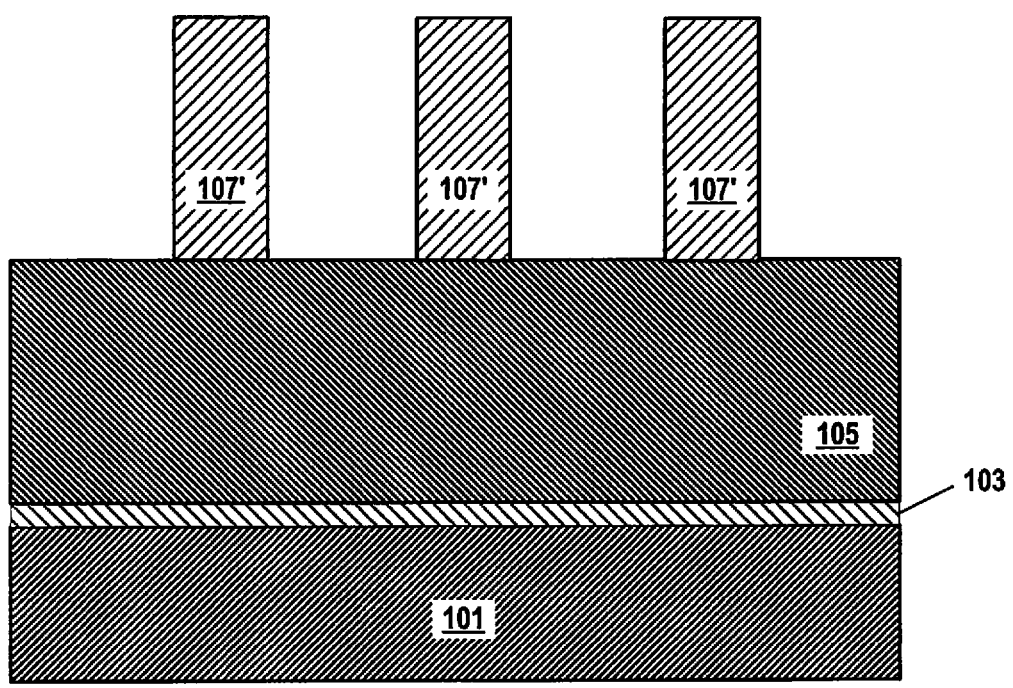
FIG. 2 is a cross-sectional diagram depicting the structure in an intermediate stage after a hardmask definition according to a first embodiment of the invention.

FIG. 2 is a cross-sectional diagram depicting the structure in an intermediate stage after a hardmask definition according to a first embodiment of the invention. A conventional etch process and lithography removal process are used to create the depicted structure from that depicted in FIG. 1. In these processes, the hardmask layer 107 is patterned into a set of hardmask elements 107' in the pattern in which certain of the metal elements which are desired.

Figure 3:
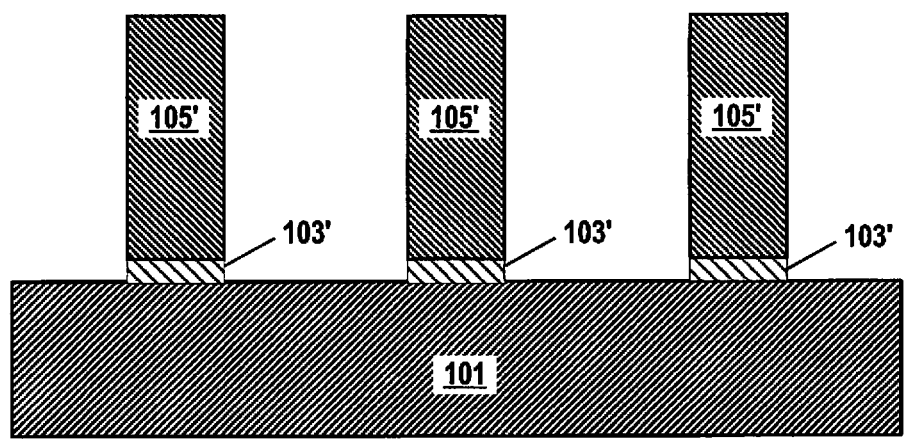
FIG. 3 is a cross-sectional diagram depicting the structure after a pattern transfer into the metal layer and a hard mask removal according to the first embodiment of the invention.

FIG. 3 is a cross-sectional diagram depicting the structure after a pattern transfer into the metal layer and a hard mask removal according to the first embodiment of the invention. In this drawing, the metal layer 105 and the liner layer 103 have been patterned according to the pattern defined by the hardmask to create metal lines 105' and liner layer elements 103'. Then, the hardmask is removed in a hardmask removal process. These steps are performed with conventional processes in embodiments of the invention. In embodiments of the invention, the width of metal lines ranges from 3 nm to 13 nm and the metal lines are patterned by reactive ion plasma etching (RIE) processes)

In this description, the patterned metal layer is also called a first metal interconnection pattern. Individual elements within the interconnection pattern are usually referred to as metal lines, but metal vias and other structures can be fabricated in embodiments of the invention. As will be seen, the first metal interconnection pattern serves as a mandrel for a second interconnection pattern. In semiconductor processing, a mandrel is used to pattern secondary features which have been already formed using a first mask. Those skilled in the art will appreciate that a variety of metal features can be formed using a mandrel based technique.

Figure 4:
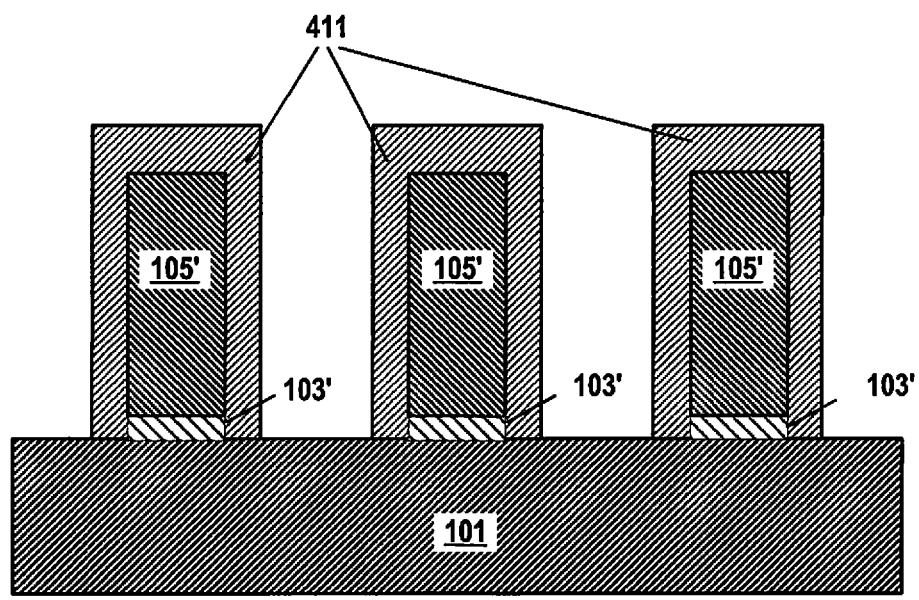
FIG. 4 is a cross-sectional diagram depicting the structure after a selective metal spacer deposition according to the first embodiment of the invention.

FIG. 4 is a cross-sectional diagram depicting the structure after a selective metal spacer deposition according to the first embodiment of the invention. In preferred embodiments of the invention, the material for the spacer 411 is selected from a group of materials which can be selectively deposited on the metal lines 105' made from metal layer 105 and the patterned liner layer elements 103', but without depositing on the substrate layer 101. In an embodiment which uses TaN as the liner layer and Ru as the metal line, Co, Cu and TiN are suitable spacer materials. Generally, the spacer material will be a metal or metallic nitride, carbide or oxide. However, other embodiments which use different liner and metal line materials will use different materials as the spacer material. Like the width of metal lines, the width of the spacers is preferably in the range of 2 nm to 13 nm. Known processes such as PVD are used for the selective spacer material (e.g., a metal) deposition. Note that in this step, a layer of material for the metal spacers 411 is deposited on the metal and metallic materials used for the liner layer elements 103' and the metal lines 105', but not on the dielectric substrate layer 101.

Because the metal spacers 411 are selectively deposited on the metal lines 105' which serve as a mandrel for future steps, they are not deposited on the substrate layer 101. Thus, unlike the prior art, an etch step is not needed to remove the undesired portions of the spacer layer deposited on the substrate between metal lines 105' (not shown as these occur in the prior art). The etch step in the prior art had two undesired characteristics. First, to clear the undesired spacer material on the substrate layer 101, the substrate layer 101 where the second metal pattern to be fabricated between metal line 105' would be gouged nonuniformly. When the non-mandrel interconnection elements are fabricated, they would be in the gouges, resulting in different heights of the mandrel and non-mandrel metal patterns. The non-mandrel metal features could have non-uniform heights within the feature or between features. Typically, the gouging results in a rounded profile at the bottom of the second metal pattern and the associated liner/barrier layers. Second, the metal spacers 411 would be unpredictably recessed at the top corner edges of the metal lines 105' causing non-linearity or "wiggling" of the lines. This problem is more easily understood with reference to FIG. 6. Instead of the planar and even top corners of the metal spacers 411 created by the CMP step, the etch step created irregular top corners. Because some of the top corner edges would have a full metal spacer to the top of the metal line and some would have a metal spacer going partially up the metal line, this causes the line wiggling of the non-mandrel metal lines 515'. The line wiggling could be ameliorated with a deeper CMP of the excess overburden metal removal but that would reduce the height of the lines. Because this etch step is not needed, the difficulties in etching the metal spacer 411 is avoided.

Figure 5:
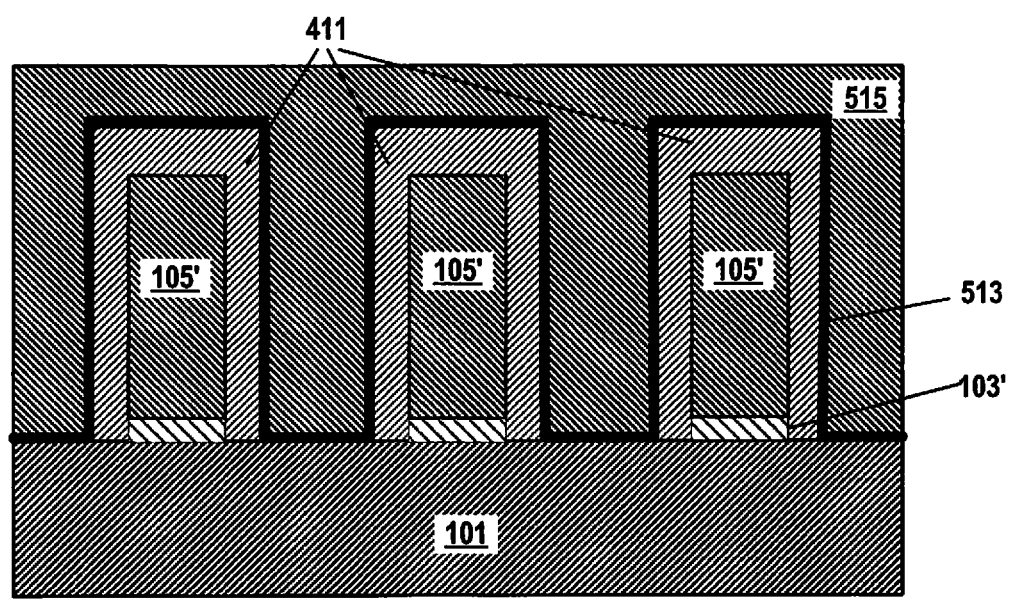
FIG. 5 is a cross-sectional diagram depicting the structure after a metal fill process according to the first embodiment of the invention.

FIG. 5 is a cross-sectional diagram depicting the structure after a metal fill process according to the first embodiment of the invention. This drawing also shows an optional liner layer 513. In preferred embodiments, the metal selected for the liner layer 513 is complementary to the spacer 411 and the overburden metal layer 515 to be deposited in a subsequent step). In some embodiments, the liner layer 513 is comprised of Co or Ru. Next, the overburden metal layer 515 is deposited. Conventional deposition processes are used to deposit the liner layer 513 and the overburden metal layer 515. In embodiments of the invention, the metal selected for the overburden layer 515 is the same as used for the metal lines 105'. In other embodiments, different materials are used for the adjacent metal lines (or other interconnects) 105', 515' which are deposited in the two respective deposition steps. Although in many embodiments the adjacent interconnects 105', 515' are made of the same material, the ability to form the interconnects 105', 515' of different metals provides flexibility to choose a different conductive material from mandrel interconnects if there is a need for particular interconnect features to be comprised of a different material.

Figure 6:
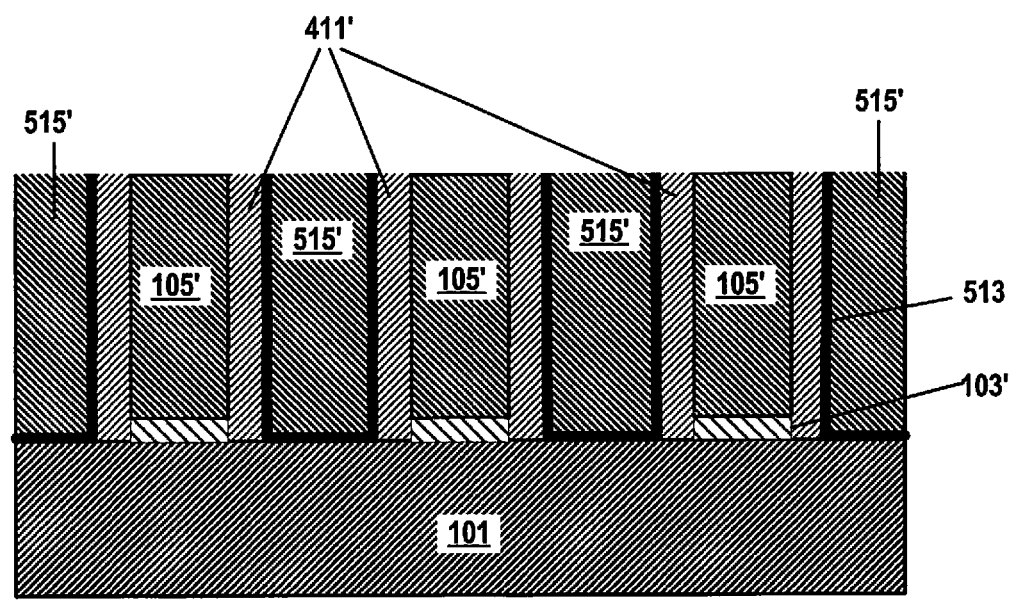
FIG. 6 is a cross-sectional diagram depicting the structure after a chemical mechanical polishing (CMP) process according to the first embodiment of the invention.

FIG. 6 is a cross-sectional diagram depicting the structure after a chemical mechanical polishing (CMP) process according to the first embodiment of the invention. As shown in the figure, the CMP step is sued to remove the excess overburden metal 515, the liner and the spacer 411 above the top of the metal lines 105'.

As implied by its name, CMP is a process in which chemical and mechanical components work together to remove material from the semiconductor wafer. In CMP, a polisher applies a downward force on a polishing pad containing a slurry contacting a patterned (usually) semiconductor wafer. Slurries are composed of abrasive particles, oxidizers, organic compounds such as dispersant and passivation agents, and deionized water (DIW). Specific slurry formulations are selected depending on the surface materials to be polished. A slurry may be selective, meaning that it etches some materials faster than others, or non-selective, meaning that it etches the materials on the substrate surface substantially at the same rate. The type of slurry is selected depending on the non-mandrel materials which need to be removed, i.e., largely the overburden layer 515, but also the spacer layer 411 and the liner layer 513. Many slurry compositions are known to the art depending on the composition of these layers. Other embodiments use other planarization processes.

After the planarization process, the reader can more readily understand the relative positions of the mandrel (metal lines 105') and non-mandrel (metal lines 515') interconnect features. The non-mandrel interconnect features are interleaved between the mandrel interconnect features in this example. One skilled in the art would understand through the use of blockout and other masks, the non-mandrel features can be selectively formed along the spacer and mandrel features where needed according to the chip design.

Figure 7:
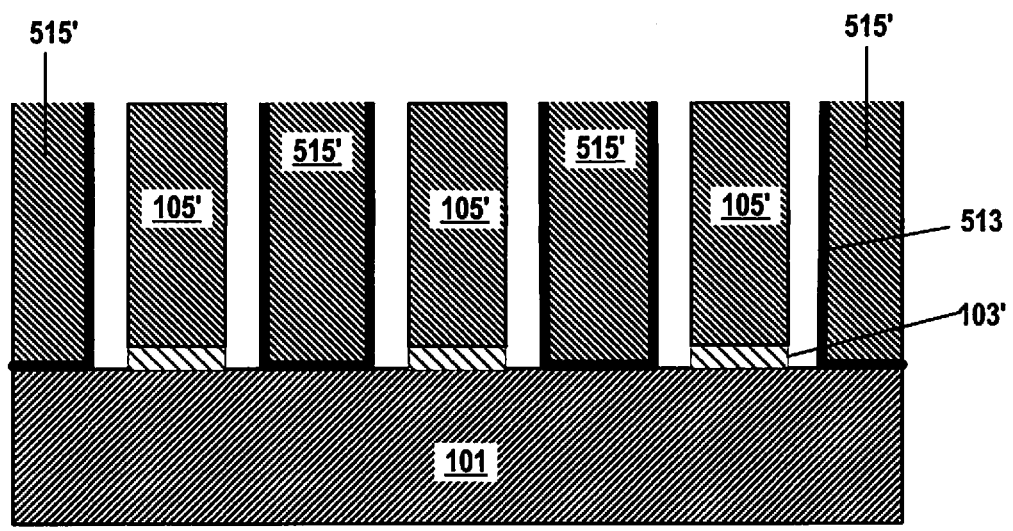
FIG. 7 is a cross-sectional diagram depicting the structure after a metal removal process according to the first embodiment of the invention.

FIG. 7 is a cross-sectional diagram depicting the structure after a spacer metal removal process according to the first embodiment of the invention. A wet etch or reactive ion etch (RIE) is used to remove the spacer metal. The etch is selected to be selective to remove the spacer metal but leaving the metal lines 105', 515' and the second liner layer 513 and the first liner layer 103. Note that after spacer removal, the material used in the overburden layer now forms a pattern of metal lines 515' between the original lines 105. If Ru is used as the metal for metal lines 105', 515' and TaN or TiN is used for the first liner and Co or Ru is used for the second liner layer 513, for a Cu spacer layer, one appropriate wet etch is an H2O/HNO3 mixture. However, in other embodiments using other materials, different known etch processes are used.

Figure 8:
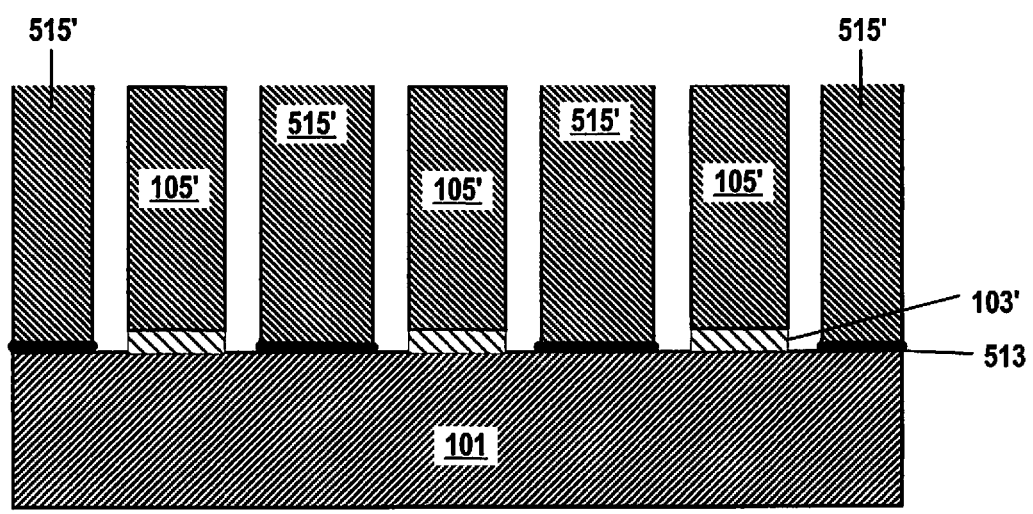
FIG. 8 is a cross-sectional diagram depicting the structure after a liner removal process according to the first embodiment of the invention.

FIG. 8 is a cross-sectional diagram depicting the structure after a liner removal process according to the first embodiment of the invention. In this removal process, e.g., an etch step, the second liner layer 513 is removed from the sidewalls of metal lines 515'. If Ru is used as the metal for metal lines 105', 515', and Co is used as the liner layer, one suitable process is a wet etch with an HCl/H2O2 mixture. Other known removal processes are used in other embodiments of the invention. While it is possible that a slight undercut of the liner layers 103, 513 under the metal lines 105', 515' will occur, in practice the undercut can be managed by controlling the etching process. In embodiments in which Ru is used for both the metal lines 105', 515' and the second liner layer 513, the second liner layer 513 does not need to be removed although the liner layer dimensions will need to be factored into the final desired dimension of the non-mandrel interconnect features.

Figure 9:
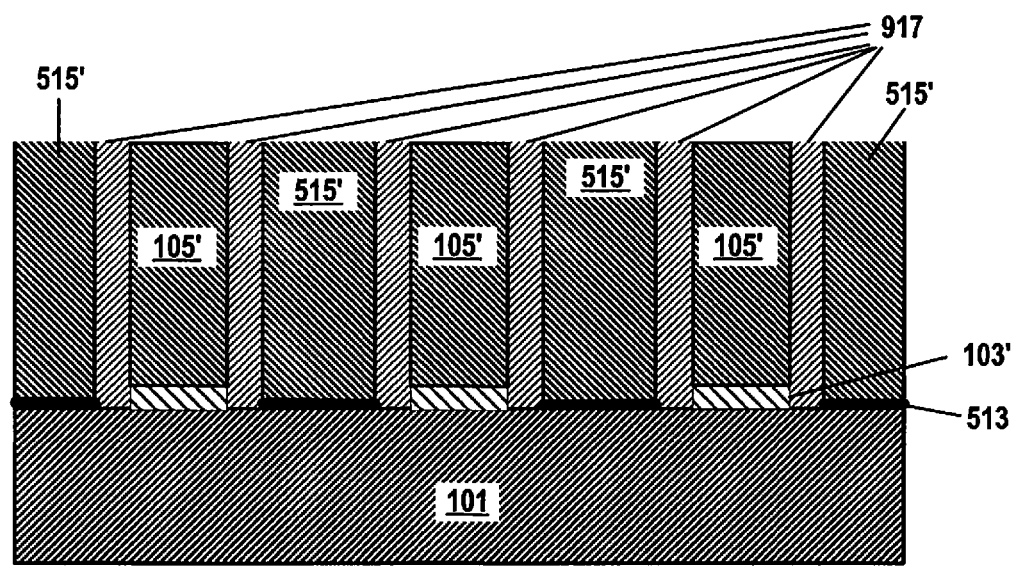
FIG. 9 is a cross-sectional diagram depicting the structure after an interlayer dielectric (ILD) layer fill process and a CMP process according to the first embodiment of the invention.

FIG. 9 is a cross-sectional diagram depicting the structure after an interlayer dielectric (ILD) layer fill process and a CMP process according to the first embodiment of the invention. The interlayer dielectric (ILD) layer 917 is selected from a group of dielectrics such as such silicon dioxide (SiO2), silicon nitride (SiN), silicon carbide (SiC), or low-k dielectric materials. The dielectric layer 917 can be deposited with known processes such as physical vapor deposition (PVD). Although a nonselective CMP process is used in preferred embodiments to remove excess dielectric above the metal interconnect features (e.g., metal lines 105', 515') other planarization processes are known to the art and used in alternative embodiments of the invention.

Because the etch step of the prior art was not needed, the top surface of the substrate layer 101 is not gouged so that the liner layer 513 and bottom surface of the non-mandrel metal lines 515' are planar. (The bottoms of the mandrel metal lines 105' are also planar, though this was not a problem with the prior art, since these parts of the substrate layer were not subjected to the prior art etch step.) Due to the CMP step, the top surfaces of the mandrel metal lines 105' and non-mandrel metal lines 515' are coplanar, i.e., in the same plane. If the thicknesses of liner layer 103' and second liner 513 are equal, then the bottom surfaces of surfaces of the mandrel metal lines 105' and non-mandrel metal lines 515' would also be coplanar, but in embodiments of the invention, the thicknesses of line layers 103', 513 are different.

Figure 10:
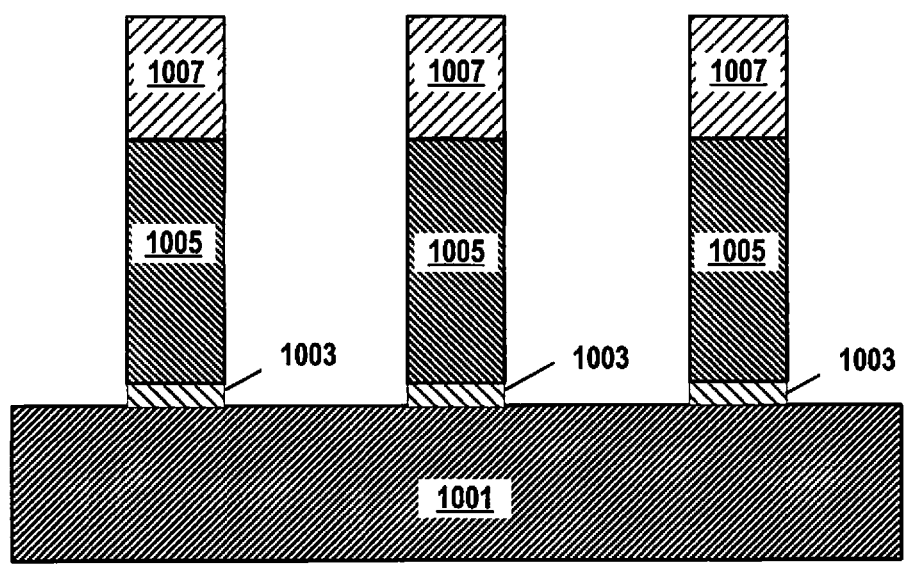
FIG. 10 is a cross-sectional diagram depicting the structure after a pattern transfer into the metal layer according to a second embodiment of the invention.

FIG. 10 is a cross-sectional diagram depicting the structure after a pattern transfer into the metal layer according to a second embodiment of the invention. This intermediate stage is similar to that discussed above in connection with FIG. 3 of the first embodiment. However, in this embodiment, after hardmask 1007 is used to pattern metal lines 1005 and liner layer 1003 over substrate 1001, some of the hardmask 1007 is retained for further processing. The materials and processes used for the hardmask 1007, metal lines 1005, liner layer and substrate 1001 are similar to those discussed above in connection with the first embodiment. As above, metal lines 1005 are used as a mandrel to pattern over metal interconnect features.

Figure 11:
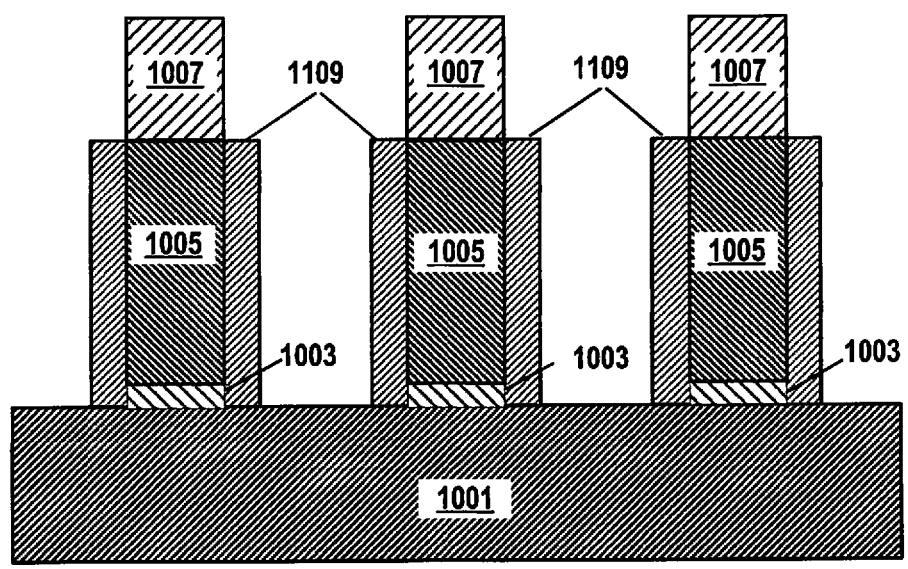
FIG. 11 is a cross-sectional diagram depicting the structure after a selective metal spacer deposition process according to a second embodiment of the invention.

FIG. 11 is a cross-sectional diagram depicting the structure after a selective metal spacer deposition process according to a second embodiment of the invention. This intermediate stage is similar to that discussed above in connection with FIG. 4 of the first embodiment. However, in this embodiment, the selective deposition of the metallic spacer 1109, e.g., Co, Ru, does not deposit on the hardmask 1007, but only on the metal lines 1005 and the liner layer 1003. Similar to the first embodiment, the spacer layer 1109 is not deposited on the substrate 1001 (except in the small thickness due to the presence of the liner layer 1003. Thus, because the hardmask 1007 covers the top of the metal lines 1005, the spacer layer 1109 is not deposited on top of the metal lines 1005 as it is in the first embodiment. The materials and processes used for spacer layer 1109 are similar to those discussed above in connection with the first embodiment. In this embodiment, the hardmask material is selected so that the selective deposition of the metallic spacer 1109 does not deposit on the hardmask 1007, e.g., by using a dielectric material for the hardmask.

In yet other embodiments, the spacer layer is deposited over the hardmask, but removed in subsequent planarization steps.

Figure 12:
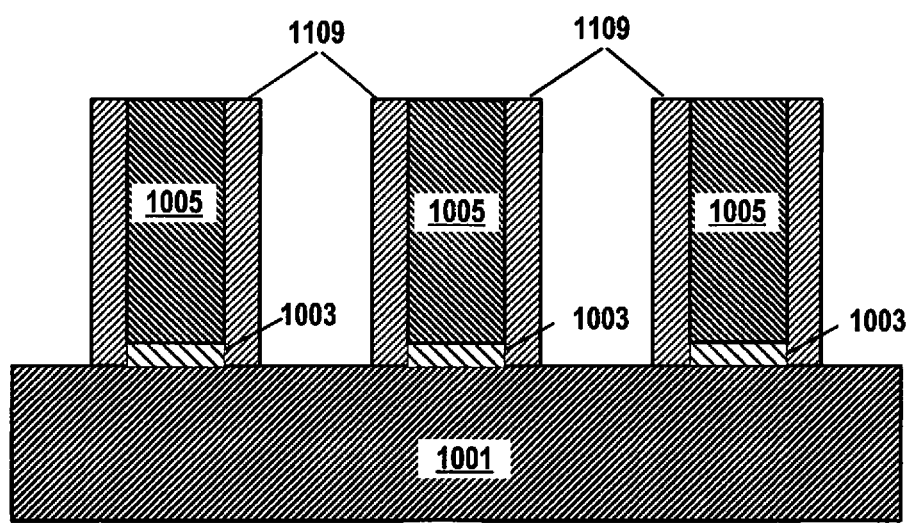
FIG. 12 is a cross-sectional diagram depicting the structure after a hardmask removal process according to a second embodiment of the invention.

FIG. 12 is a cross-sectional diagram depicting the structure after a hardmask removal process according to a second embodiment of the invention. This intermediate stage is also somewhat similar to that discussed above in connection with FIG. 4 of the first embodiment. However, in this embodiment, because of the selective deposition of the spacer layer 1109, the spacer layer 1109 is not deposited on top of the metal lines 1005 as it is in the first embodiment. The processes used for removal of the hardmask 1007 are similar to those discussed above in connection with the first embodiment.

Figure 13:
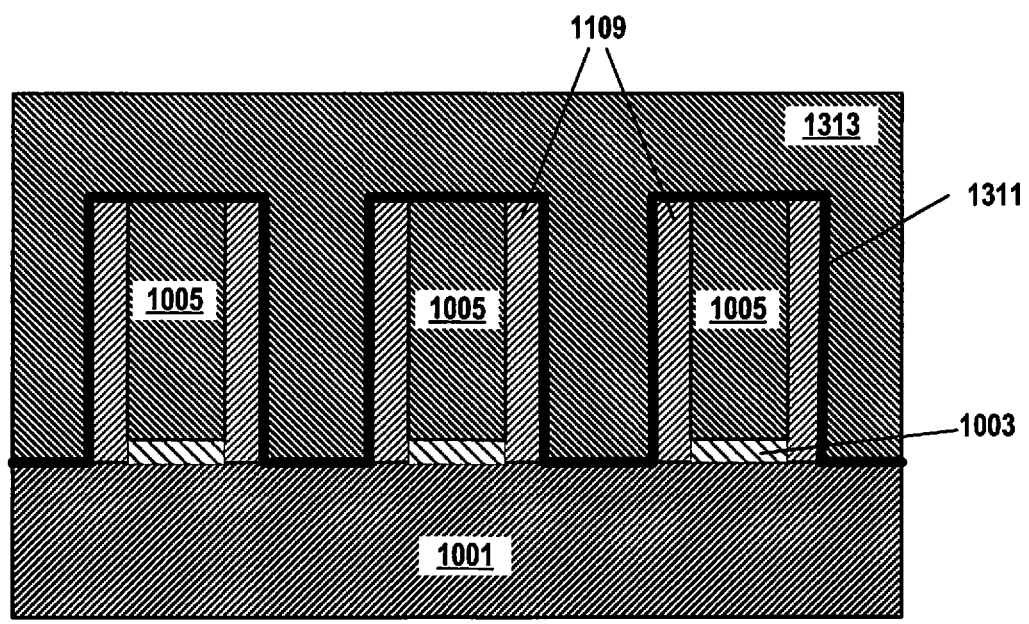
FIG. 13 is a cross-sectional diagram depicting the structure after a liner deposition process and a metal fill process according to a second embodiment of the invention.

FIG. 13 is a cross-sectional diagram depicting the structure after a liner deposition process and a metal fill process according to a second embodiment of the invention. This intermediate stage is similar to that discussed above in connection with FIG. 5 of the first embodiment. However, in this embodiment, because the spacer layer 1109 is not deposited on top of the metal lines 1005 as it is in the first embodiment, the liner layer 1311 is deposited directly on top of the metal lines. As in FIG. 5, the overburden layer 1313 is intentionally deposited thicker than desired for the final height of the interconnection elements so to assure a good fill of the non-mandrel metal interconnection features. The materials and processes used for the liner layer 1311 and metal fill (overburden) layer 1313 are similar to those discussed above in connection with the first embodiment.

Figure 14:
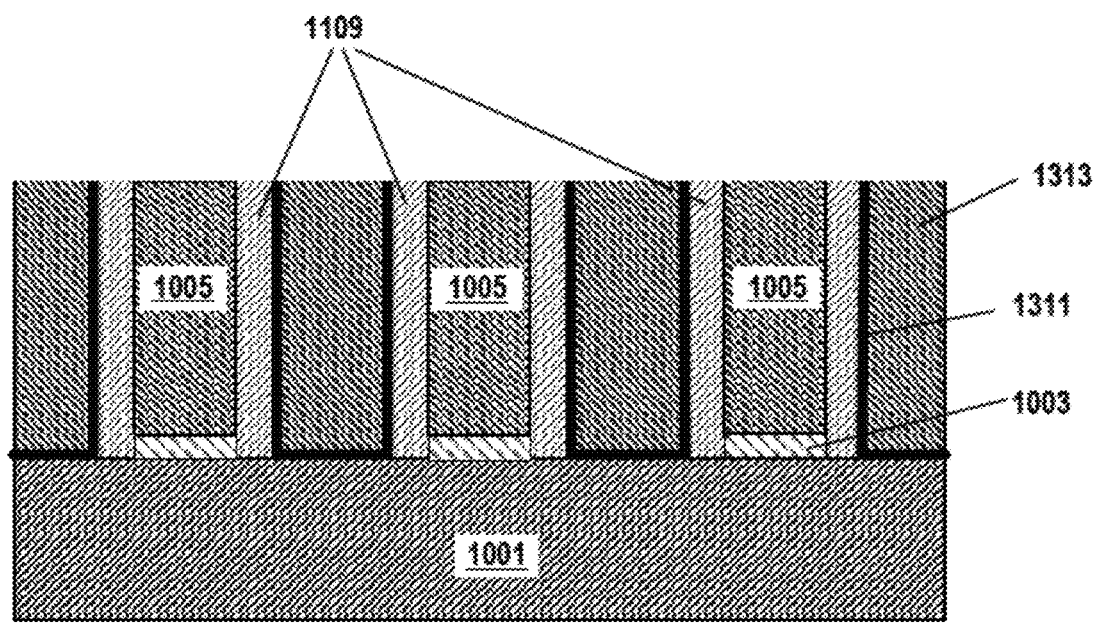
FIG. 14 is a cross-sectional diagram depicting the structure after a CMP process according to a second embodiment of the invention.

FIG. 14 is a cross-sectional diagram depicting the structure after a CMP process according to a second embodiment of the invention. This intermediate stage is similar to that discussed above in connection with FIG. 6 of the first embodiment. In this process, the excess overburden layer 1313 is removed. The processes used for the CMP (or other planarization) process are similar to those discussed above in connection with the first embodiment.

Figure 15:
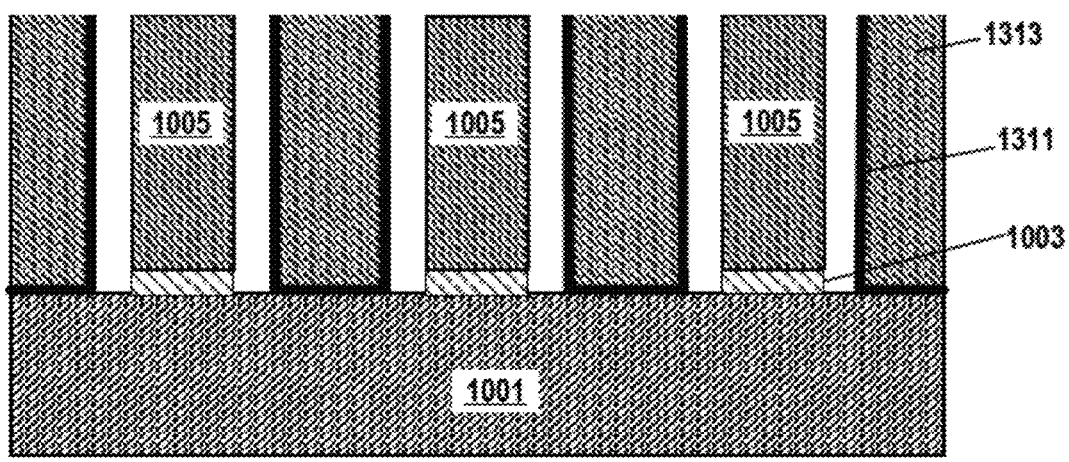
FIG. 15 is a cross-sectional diagram depicting the structure after a metal removal process according to a second embodiment of the invention.

FIG. 15 is a cross-sectional diagram depicting the structure after a metal removal process according to a second embodiment of the invention. This intermediate stage is similar to that discussed above in connection with FIG. 7 of the first embodiment. In this step, the processes used to remove spacer layer 1109 are similar to those discussed above in connection with the first embodiment.

Figure 16:
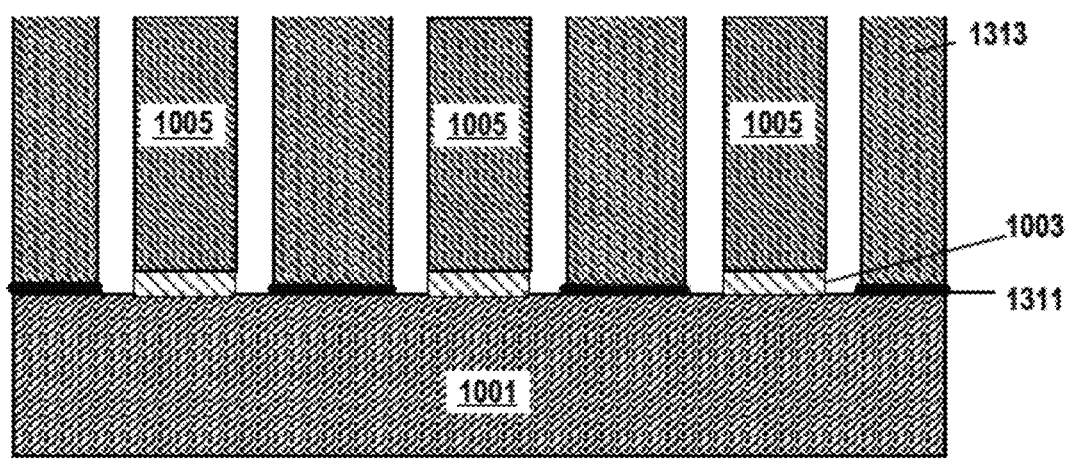
FIG. 16 is a cross-sectional diagram depicting the structure after a liner removal process according to a second embodiment of the invention.

FIG. 16 is a cross-sectional diagram depicting the structure after a liner removal process according to a second embodiment of the invention. The liner removal process is similar to that discussed above in connection with FIG. 8 of the first embodiment. Therefore, similar processes are used to those discussed above.

Figure 17:
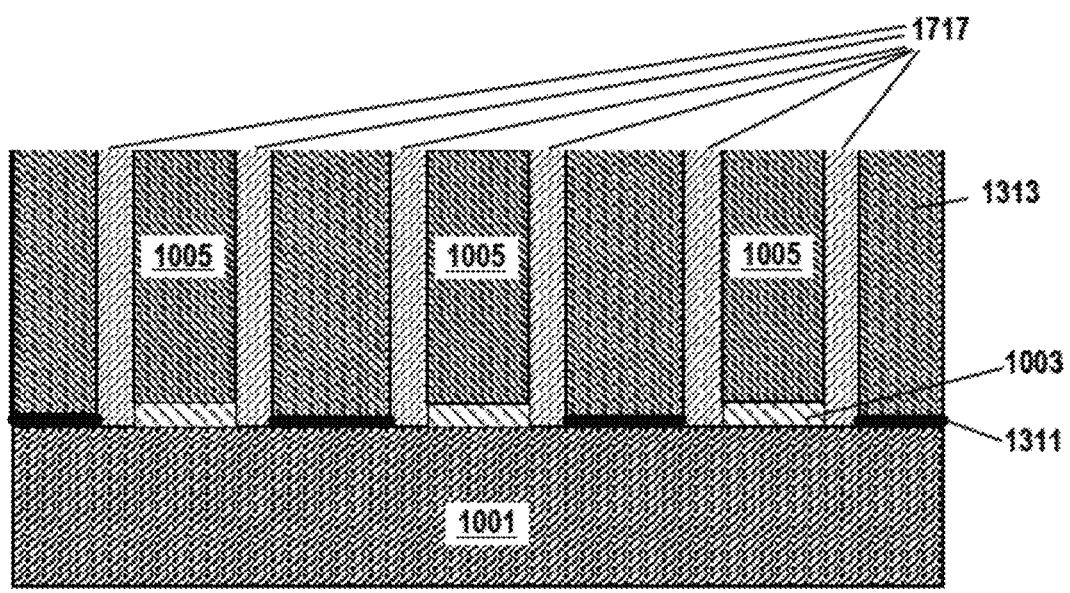
FIG. 17 is a cross-sectional diagram depicting the structure after an interlayer dielectric (ILD) layer fill process and a CMP process according to a second embodiment of the invention.

FIG. 17 is a cross-sectional diagram depicting the structure after an interlayer dielectric (ILD) layer fill process and a CMP process according to a second embodiment of the invention. As shown, an ILD layer 1717 is deposited and planarized similar to the processes discussed above in connection with FIG. 9 of the first embodiment. The materials and processes used for ILD deposit and CMP processes are used in variations of the second embodiment.

As is known to the art, the structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

The invention has advantages over the prior art. Because the spacer is selectively deposited on the metal interconnect pattern which serves as a mandrel, it is not deposited on the substrate. Thus, an etch step is not needed to remove the undesired portions of the spacer layer deposited on the substrate. The etch step in the prior art had two undesired characteristics: First, to clear the spacer on the substrate, the substrate where the second metal pattern is fabricated would be gouged, resulting in different heights of the first and second metal patterns. Typically, the gouging results in a rounded profile at the bottom of the second metal pattern and the associated liner/barrier layers. Second, the spacer is unpredictably recessed at the top corner edges of the first metal pattern. This causes the line wiggling and also necessitates a deeper CMP at the time of the excess overburden metal removal which reduces the height of the lines. With the inventive process, there is no undesired spacer recess at the top of the mandrel pattern nor unwanted gouging into the substrate. There is no line height variation due to the gouging of the substrate and shallow lines are not a problem nor non-linearity or wiggling of the metal lines due to non-uniform spacer heights at the top corners.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A structure comprising:
   a first liner layer over a substrate;
   a first plurality of elements of a first metal interconnection pattern directly on the first liner layer;
   a second liner layer over the substrate;
   a second plurality of elements of a second metal interconnection pattern directly on the second liner layer, wherein each element of the first plurality of elements is positioned between two elements from the second plurality of elements; and
   an interlayer dielectric between and physically separating the first plurality of elements from the second plurality of elements, wherein the interlayer dielectric directly contacts sidewalls of the first plurality of elements and sidewalls of the second plurality of elements,
      wherein a top surface of the first plurality of elements share a first plane with a top surface of the second plurality of elements,
      wherein a bottom surface of the first plurality of elements share a second plane with one another,
      wherein a bottom surface of the second plurality of elements share a third plane with one another,
      wherein the second plane is different from the third plane.

2. The structure of claim 1, wherein a first thickness of the first liner layer is different than a second thickness of the second liner layer.

3. The structure of claim 1, wherein the first liner layer does not contact the sidewalls of the first plurality of elements, and the second liner layer does not contact the sidewalls of the second plurality of elements.

4. The structure of claim 1, wherein the first metal interconnection pattern and the second metal interconnection pattern comprise a same metallic material and the same metallic material is selected from the group consisting of ruthenium, cobalt, tungsten, rhodium and molybdenum.

5. The structure of claim 1, wherein the first metal interconnection pattern and the second metal interconnection pattern comprise different respective metallic materials and at least one of the first metal interconnection pattern and the second metal interconnection pattern is selected from the group consisting of ruthenium, cobalt, tungsten, rhodium, and molybdenum.

6. The structure of claim 1, wherein the first liner layer and the second liner layer comprise different metallic materials.

7. The structure of claim 1, wherein respective elements of the first metal interconnection pattern and the second metal interconnection pattern have a critical dimension of 3 nm or less.

8. A structure comprising:
a first liner layer;
a first metal line directly on top of the first liner layer, wherein sidewalls of the first liner layer are flush with sidewalls of the first metal line;
a second liner layer;
a second metal line directly on top of the second liner layer, wherein sidewalls of the second liner layer are flush with sidewalls of the second metal line; and
an interlayer dielectric between and directly contacting the first metal line and the second metal line,
wherein a top surface of the first metal line is flush with a top surface of the second metal line,
wherein a bottom surface of the first metal line is above a bottom surface of the second metal line.

9. The structure of claim 8, wherein the first liner layer is thicker than the second liner layer.

10. The structure of claim 8, wherein a lateral width of the first liner layer is equal to a lateral width of the first metal line, and a lateral width of the second liner layer is equal to a lateral width of the second metal line.

11. The structure of claim 8, wherein the first metal line and the second metal line are made from a same metallic material, and the same metallic material is selected from the group consisting of ruthenium, cobalt, tungsten, rhodium and molybdenum.

12. The structure of claim 8, wherein the first metal line and the second metal line are made from different metallic materials, and the different metallic materials are selected from the group consisting of ruthenium, cobalt, tungsten, rhodium and molybdenum.

13. The structure of claim 8, wherein the first liner layer and the second liner layer are made from different conductive materials.

14. The structure of claim 8, wherein a lateral width of the first liner layer is less than 3 nm, and a lateral width of the second liner layer is less than 3 nm.

15. The structure of claim 8, further comprising:
a substrate, wherein both the first liner layer and the second liner layer are directly on the substrate.

16. A structure comprising:
a first liner layer;
a first metal line directly on top of the first liner layer;
a second liner layer;
a second metal line directly on top of the second liner layer; and
an interlayer dielectric between and directly contacting the first metal line and the second metal line,
wherein a top surface of the first metal line is flush with a top surface of the second metal line,
wherein a bottom surface of the first metal line is above a bottom surface of the second metal line.

17. The structure of claim 16, wherein the first liner layer is thicker than the second liner layer.

18. The structure of claim 16, wherein a lateral width of the first liner layer is equal to a lateral width of the first metal line, and a lateral width of the second liner layer is equal to a lateral width of the second metal line.

19. The structure of claim 16, wherein the first metal line and the second metal line are made from a same metallic material, and the same metallic material is selected from the group consisting of ruthenium, cobalt, tungsten, rhodium and molybdenum.

20. The structure of claim 16, wherein the first metal line and the second metal line are made from different metallic materials, and the different metallic materials are selected from the group consisting of ruthenium, cobalt, tungsten, rhodium and molybdenum.

* * * * *